United States Patent
Joo et al.

(10) Patent No.: US 6,909,654 B2
(45) Date of Patent: Jun. 21, 2005

(54) BIT LINE PRE-CHARGE CIRCUIT OF SEMICONDUCTOR MEMORY DEVICE

(75) Inventors: Jae-Hoon Joo, Yongin (KR); Jin-Seok Lee, Yongin (KR); Sang-Seok Kang, Suwon (KR); Kyu-Chan Lee, Seoul (KR); Byung-Heon Kwak, Suwon (KR); Byung-Chul Kim, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 146 days.

(21) Appl. No.: 10/633,562

(22) Filed: Aug. 5, 2003

(65) Prior Publication Data

US 2004/0027897 A1 Feb. 12, 2004

(30) Foreign Application Priority Data

Aug. 6, 2002  (KR) ................................ 10-2002-0046378

(51) Int. Cl.$^7$ ................................................ G11C 7/00
(52) U.S. Cl. .......................... 365/203; 365/190; 365/202
(58) Field of Search ................................ 365/190, 202, 365/203

(56) References Cited

U.S. PATENT DOCUMENTS

| | | | | |
|---|---|---|---|---|
| 5,499,211 A | * | 3/1996 | Kirihata et al. | 365/203 |
| 5,673,231 A | * | 9/1997 | Furutani | 365/203 |
| 6,018,481 A | * | 1/2000 | Shiratake | 365/190 |
| 6,343,038 B1 | * | 1/2002 | Makino et al. | 365/203 |
| 6,775,194 B2 | * | 8/2004 | Chen | 365/203 |

* cited by examiner

Primary Examiner—Son Mai
(74) Attorney, Agent, or Firm—Lee & Morse, P.C.

(57) ABSTRACT

A bit line pre-charge circuit of a semiconductor memory device includes a pre-charge circuit connected between a pair of bit lines for pre-charging the pair of bit lines in response to a pre-charge control signal and a pre-charge voltage transmitting circuit for transmitting a pre-charge voltage to the pre-charge circuit in response to the pre-charge control signal. A voltage drop in a pre-charge voltage generation line may be prevented when a short circuit is formed between a word line and a pair of bit lines, and current consumption during a standby operation of the semiconductor memory device may also be reduced, by preventing current from flowing from the pair of bit lines to the pre-charge voltage generation line.

18 Claims, 5 Drawing Sheets

BIT LINE PRE-CHARGE CIRCUIT OF SEMICONDUCTOR MEMORY DEVICE

BACKGROUND OF INVENTION

1. Field of the Invention

The present invention relates to a bit line pre-charge circuit for a semiconductor memory device.

2. Description of Related Art

A bit line pre-charge circuit pre-charges a pair of bit lines to a predetermined voltage level during a pre-charging operation. Generally, a pre-charge voltage is set to a half power supply voltage Vcc/2, which is a voltage halfway between a power supply voltage Vcc and a ground voltage of 0V.

When the pre-charge voltage is higher than the half power supply voltage Vcc/2, a data margin of logic "high" level data is reduced. On the contrary, when the pre-charge voltage is lower than the half power supply voltage Vcc/2, a data margin of logic "low" level data is reduced.

More particularly, in a state that a pair of bit lines is pre-charged to the half power supply voltage Vcc/2 during a pre-charging operation, a charge-sharing operation between a memory cell connected to a word line and the pair of bit lines occurs when the word line is selected during an active operation. At this time, if the bit line pair is pre-charged to a voltage that is higher than the half power supply voltage Vcc/2, a PMOS bit line sense amplifier may not be able to properly or sufficiently amplify the logic "high" level of data on the bit line pair to the power supply voltage.

In the same manner, if the bit line pair is pre-charged to a voltage level that is less than the half power supply voltage Vcc/2, an NMOS bit line sense amplifier may not be able to adequately or properly amplify the logic "low" level of data on the bit line pair to the ground voltage. Accordingly, it is necessary to maintain a pre-charge voltage level of the bit line pair at the half power supply voltage Vcc/2 during the pre-charge operation.

FIG. 1 illustrates a circuit diagram of a bit line pre-charge circuit of a conventional semiconductor memory device. This conventional bit line pre-charge circuit includes a plurality of pre-charge circuits 14-1, 14-2, 14-3 and 14-4 connected to a plurality of array bit line pairs ABL1/ABL1B, ABL2/ABL2B, ABL3/ABL3B and ABL4/ABL4B arranged at a left side of a plurality of data input/output line pairs IO1/IO1B, IO2/IO2B, IO3/IO3B and IO4/IO4B, a plurality of bit line isolation circuits 16-1, 16-2, 16-3 and 16-4, a plurality of PMOS bit line sense amplifiers 12-1, 12-2, 12-3 and 12-4, a plurality of pre-charge circuits 14-5, 14-6, 14-7 and 14-8 connected to the plurality of array bit line pairs ABL1/ABL1B, ABL2/BAL2B, ABL3/ABL3B and ABL4/ABL4B arranged at a right side of the plurality of data input/output line pairs IO1/IO1B, IO2/IO2B, IO3/IO3B and IO4/IO4B, a plurality of bit line isolation circuits 16-5, 16-6, 16-7 and 16-8, a plurality of NMOS bit line sense amplifiers 12-5, 12-6, 12-7 and 12-8, and a plurality of data input/output circuits 18-1, 18-2, 18-3 and 18-4 connected between a plurality of sense bit line pairs SBL1/SBL1B, SLB2/SBL2B, SBL3/SBL3B and SBL4/SBL4B and the plurality of data input/output line pairs IO1/IO1B, IO2/IO2B, IO3/IO3B and IO4/IO4B, respectively.

In FIG. 1, reference numerals 10-(i), 10-(i+1) and 10-(i+2) denote memory cell array blocks, and reference numerals MC1, MC2, MC3 and MC4 denote memory cells.

Operation of the pre-charge circuit of FIG. 1 will now be described.

The pre-charge circuits 14-1, 14-2, 14-3, 14-4, 14-5, 14-6, 14-7 and 14-8 each include three NMOS transistors. For example, the pre-charge circuit 14-1 includes the NMOS transistors N14, N15 and N16. The pre-charge circuits 14-2, 14-3, 14-4, 14-5, 14-6, 14-7 and 14-8 include NMOS transistors (N24, N25 and N26), . . . , (N31, N32 and N33) and (N41, N42 and N43), respectively.

The pre-charge circuits 14-1, 14-2, 14-3, 14-4, 14-5, 14-6, 14-7 and 14-8 pre-charge the array bit line pairs ABL1/ABL1B, ABL2/ABL2B, ABL3/ABL3B and ABL4/ABL4B, respectively, in response to respective pre-charge control signals PRE(i), PRE(i+1), Pre(i+2), . . . .

The bit line isolation circuits 16-1, 16-2, 16-3, 16-4, 16-5, 16-6, 16-7 and 16-8, each include two NMOS transistors N1 and N2 and isolate the array bit line pairs ABL1/ABL1B, ABL2/ABL2B, ABL3/ABL3B and ABL4/ABL4B from the sense bit line pairs SBL1/SBL1B, SBL2/SBL2B, SBL3/SBL3B and SBL4/SBL4B, respectively, in response to respective isolation control signals ISO(i), ISO(i+1), ISO(i+2), . . . .

The data input/output circuits 18-1, 18-2, 18-3 and 18-4, each include two NMOS transistors N3 and N4 and transfer data between the respective sense bit line pairs SBL1/SBL1B, SBL2/SBL2B, SBL3/SBL3B and SBL4/SBL4B and the respective data input/output line pairs IO1/IO1B, IO2/IO2B, IO3/IO3B and IO4/IO4B in response to a column selection signal CSL1.

When a short circuit occurs between a word line WLj and an array bit line ABL1, the bit line pre-charge circuit operates in a manner described below.

During the pre-charge operation, if the isolation control signals ISO(i), ISO(i+1), ISO(i+2), . . . having a power supply voltage Vcc, and the pre-charge control signals PRE (i), PRE(i+1), PRE(i+2), . . . having a power supply voltage Vcc, are generated internally, the NMOS transistors N1, N2, N11-N16, N21-N26, N31-N36 and N41-N46 are turned on. Thus, the array bit line pairs ABL1/ABL1B, ABL2/ABL2B, ABL3/ABL3B and ABL4/ABL4B and the sense bit line pairs SBL1/SBL1B, SBL2/SBL2B, SBL3/SBL3B and SBL4/SBL4B are pre-charged to a pre-charge voltage VBL. Further, since the word line WLj corresponding to the memory cell MC1 is shorted with the array bit line ABL1, current flows from the array bit line ABL1 to the word line WLj connected to a ground voltage. Accordingly, the pre-charge voltage level of the array bit line ABL1 is lowered since the word line WLj is connected to the ground voltage.

That is, current flow is generated through the NMOS transistor N12 because the NMOS transistor N12, which forms part of the pre-charge circuit 14-5, is turned on. Therefore, the pre-charge voltage VBL level of the array bit line ABL1 decreases. The decreased pre-charge voltage level of the array bit line ABL1 affects an adjacent array bit line ABL3 in a way that the pre-charge control signal PRE (i+1) having a logic "high" level is applied and then the NMOS transistor N32 in the pre-charge circuit 14-7 is turned, so that the pre-charge voltage level of the array bit line ABL3 decreases.

Accordingly, the NMOS bit line sense amplifiers 12-5 and 12-7 may not adequately or properly amplify a logic "low" level of data.

FIG. 2 illustrates a layout of a representative pre-charge circuit 14-5 of FIG. 1. Referring to FIGS. 1 and 2, reference numerals N11S, N12S and N13S denote source regions of the NMOS transistors N11, N12 and N13, respectively. Reference numerals N11D, N12D and N13D denote drain regions of the NMOS transistors N11, N12 and N13, respectively. Reference numerals N11G, NI2G and N13G denote gates of the NMOS transistors N11, N12 and N13, respectively. Reference characters l1, l2 and l3 designate channel lengths of the NMOS transistors N11, N12 and N13, respectively.

As shown in FIG. 2, an active area 30 of the NMOS transistors N11, N12 and N13 is formed in a semiconductor substrate (not shown) and has a rectangular shape. A gate body 32 having a "T" shape is formed on the active area 30 and forms gates for the NMOS transistors N11, N12 and N13. A leftward extending portion N11G of the gate body 32 forms a gate of the NMOS transistor N11, an upward extending portion N12G of the gate body 32 forms a gate of the NMOS transistor N12 and a downward extending portion N13G of the gate body 32 forms a gate of the NMOS transistor N13. Thus, the gates N11G, N12G and N13G of the NMOS transistors N11, N12 and N13 are formed in a single body 32. The source and drain regions N11S and N11D of the NMOS transistor N11 are formed at both sides of the gate N11G in the active area 30. The source and drain regions N12S and N12D of the NMOS transistor N12 are formed at both sides of the gate N12G in the active area 30. The source and drain regions N13S and N13D of the NMOS transistor N13 are formed at both sides of the gate N13G in the active area 30. Thus, a left and upper portion of the active area 30 forms a common source, N11S, N12S, for the NMOS transistors N11 and N12, and a left and lower portion of the active area 30 forms the drain N11D for the NMOS transistor N11 and the source N13S for the NMOS transistor N13. Further, a right portion of the active area 30 forms a common drain N12D and N13D for the NMOS transistors N12 and N13.

As shown in FIG. 2, the channel lengths l2 and l3 of the NMOS transistors N12 and N13 are short in comparison with the respective channel widths, so that resistances of the transistors N12 and N13 are small.

Layouts of the other pre-charge circuits of FIG. 1 are similar to that shown in FIG. 2.

Accordingly, in the conventional bit line pre-charge circuit, there is a problem in that the pre-charge voltage level of the array bit line ABL1 having a short circuit and the pre-charge voltage level of the adjacent array bit line ABL3 decrease when the short circuit is formed between the word line WLj and the array bit line ABL1. Thus, current flows from the pre-charge voltage VBL generation line to the bit line pre-charge circuits 14-5 and 14-7 through the NMOS transistors N12 and N32, each forming part of the pre-charge circuits 14-5 and 14-7, respectively, thereby causing a voltage drop in the pre-charge voltage generation line. Further, such a current flow continues during a standby operation of the semiconductor memory device, so that standby current consumption increases.

A short circuit may occur between a word line and a bit line pair due to process variations in manufacturing a semiconductor memory device. When such a short circuit occurs, the semiconductor memory device is usually repaired by replacing normal memory cells connected to the shorted word line with redundant memory cells.

In the repaired semiconductor memory device, when a pair of bit lines associated with the redundant memory cells is pre-charged to the pre-charge voltage, the pair of shorted bit lines associated with the normal memory cells is simultaneously pre-charged. Further, since a current path is formed between the shorted word line and the pair of shorted bit lines associated with the normal memory cells, the pre-charge voltage level of the pair of bit lines decreases. The decreased voltage level of the pair of bit lines affects a pre-charge circuit connected to another pair of bit lines, thereby degrading overall operation characteristics and reliability of the semiconductor memory device by lowering the pre-charge voltage level applied to the other pair of bit lines.

Further, the conventional bit line pre-charge circuit is designed in a way that transistors forming the pre-charge circuit have small resistances. Therefore, when the pre-charge voltage level of the shorted bit lines is decreased, a voltage level of a pre-charge voltage generation line is easily reduced and standby current consumption increases.

SUMMARY OF THE INVENTION

In an effort to overcome the problems described above, it is a feature of an embodiment of the present invention to provide a bit line pre-charge circuit for a semiconductor memory device capable of reducing a voltage drop in a pre-charge voltage generating line when a short circuit occurs between a word line and a pair of bit lines.

It is a feature of an embodiment of the present invention to provide a pre-charge circuit for a semiconductor memory device including first and second transistors connected in series between a pair of bit lines and each having a gate to which a pre-charge control signal is applied for transmitting a pre-charge voltage to the pair of bit lines in response to the pre-charge control signal; and a third transistor connected between the pair of bit lines and having a gate receiving the pre-charge control signal as an input for equalizing voltage levels of the pair of bit lines, wherein the first and second transistors have channel lengths longer than that of the third transistor, so that the first and second transistors have resistances higher than that of the third transistor.

In accordance with another feature of an embodiment of the present invention, there is provided a bit line pre-charge circuit of a semiconductor memory device including a plurality of pre-charge circuits, each connected between a pair of bit lines for pre-charging the respective pair of bit lines to a pre-charge voltage in response to a pre-charge control signal, and a pre-charge voltage transmitting circuit for transmitting the pre-charge voltage to the pre-charge circuit in response to the pre-charge control signal, wherein the pre-charge voltage transmitting circuit is connected to at least two pre-charge circuits.

The pre-charge voltage transmitting circuit preferably has a higher resistance than that of the pre-charge circuits.

Preferably, the bit-line pre-charge circuit includes first and second NMOS transistors connected in series between the pair of bit lines and having a gate receiving the pre-charge control signal as an input for transmitting the pre-charge voltage to the pair of bit lines in response to the pre-charge control signal, and a third NMOS transistor connected between the pair of bit lines and having a gate receiving the pre-charge control signal as an input for equalizing voltage levels of the pair of bit lines in response to the pre-charge control signal.

The pre-charge voltage transmitting circuit preferably includes a fourth NMOS transistor connected between a common node of the first and second NMOS transistors and a pre-charge voltage generating line supplying the pre-charge voltage, and having a gate to which the pre-charge control signal is applied.

In accordance with another feature of an embodiment of the present invention, there is provided a bit line pre-charge circuit of a semiconductor memory device including a plurality of word lines respectively selected in response to a plurality of word line selection signals, a plurality of pairs of bit lines formed perpendicular to the word lines and selected by a plurality of column selection signals, a plurality of memory cells, each connected between one of the plurality of word lines and one of the plurality of pairs of bit lines, and a plurality of pre-charge circuits for pre-charging the plurality of pairs of bit lines in response to a plurality of pre-charge control signals, wherein each of the pre-charge circuits includes first and second NMOS transistors connected in series between a pair of the plurality of pairs bit lines and having a gate receiving a pre-charge control signal of the plurality of pre-charge control signals as an input for transmitting a pre-charge voltage to a pair of the plurality of pairs of bit lines in response to the pre-charge control signal, and a third NMOS transistor connected between the pair of the plurality of pairs of bit lines and having a gate receiving the pre-charge control signal as an input for equalizing voltage levels of the pair of the plurality of pairs of bit lines in response to the pre-charge control signal, and the first and second transistors have channel lengths longer than that of the third transistor, so that the first and second transistors have resistances higher than that of the third transistor.

In accordance with another feature of an embodiment of the present invention, there is provided a bit line pre-charge circuit of a semiconductor memory device including a plurality of word lines respectively selected by a plurality of word line selection signals, a plurality of pairs of bit lines formed perpendicular to the word lines and selected by a plurality of column selection signals, a plurality of memory cells, each connected between a word line of the plurality of word lines and a pair of the plurality of pairs of bit lines, a plurality of pre-charge circuits for pre-charging the plurality of pairs of bit lines in response to a plurality of pre-charge control signals, and a plurality of pre-charge voltage transmitting circuits for transmitting a pre-charge voltage to the pre-charge circuits in response to the plurality of pre-charge control signals.

Preferably, resistances of each of the pre-charge voltage transmitting circuits are higher than those of the pre-charge circuits.

Preferably, each of the pre-charge circuits includes first and second NMOS transistors connected in series between a pair of the plurality of pairs of bit lines and having a gate receiving a pre-charge control signal of the plurality of pre-charge control signals as an input for transmitting the pre-charge voltage to the pair of the plurality of pairs of bit lines in response to the pre-charge control signal; and a third NMOS transistor connected between the pair of the plurality of pairs of bit lines and having a gate receiving the pre-charge control signal.

Preferably, each of the pre-charge voltage transmitting circuits corresponds to a predetermined number of pre-charge circuits that are adjacent to each other and that are selected by the same column selection signal.

Each of the pre-charge voltage transmitting circuits preferably includes a fourth NMOS transistor connected to a common node of the first and second NMOS transistors that form the pre-charge circuits and that are turned on in response to the pre-charge control signal.

In accordance with another feature of an embodiment of the present invention, there is provided a bit line pre-charge circuit of a semiconductor memory device that includes a first pre-charge circuit formed in a first bit line area and a second pre-charge circuit formed in a second bit line area including a first transistor formed in the first bit line area, and a second transistor formed in the second bit line area, wherein a channel of the first transistor starts from a first area of the first bit line and extends over the second bit line area.

The channel of the first transistor preferably extends to a second area of the first bit line area.

The first and second areas are preferably connected to the same bit line area.

A channel of the second transistor preferably starts from the second bit line area and ends in the first bit line area.

In accordance with another feature of an embodiment of the present invention, there is provided a bit line pre-charge circuit of a semiconductor memory device having a first bit line area in which a first transistor is formed and a second bit line area in which a second transistor is formed, including a first active area in which the first transistor is formed, a second active area in which the second transistor is formed, and a third active area in which a third transistor is formed, wherein one side of the first active area is connected to one side of the second active area and the one side of the second active area is connected to one side of the third active area.

Preferably, the third transistor is formed across the first bit line area and the second bit ine area.

Channels of the first, second and third transistors are preferably formed in the first, second and third active areas, respectively.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION OF PREFERRED EMBODIMENTS

Korean Patent Application No. 2002-46378, filed on Aug. 6, 2002, and entitled: "Bit Line Pre-Charge Circuit of Semiconductor Memory Device and Layout Method Thereof" is incorporated by reference herein in its entirety.

The present invention will now be described more fully hereinafter with reference to the accompanying drawings, in which preferred embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 3:
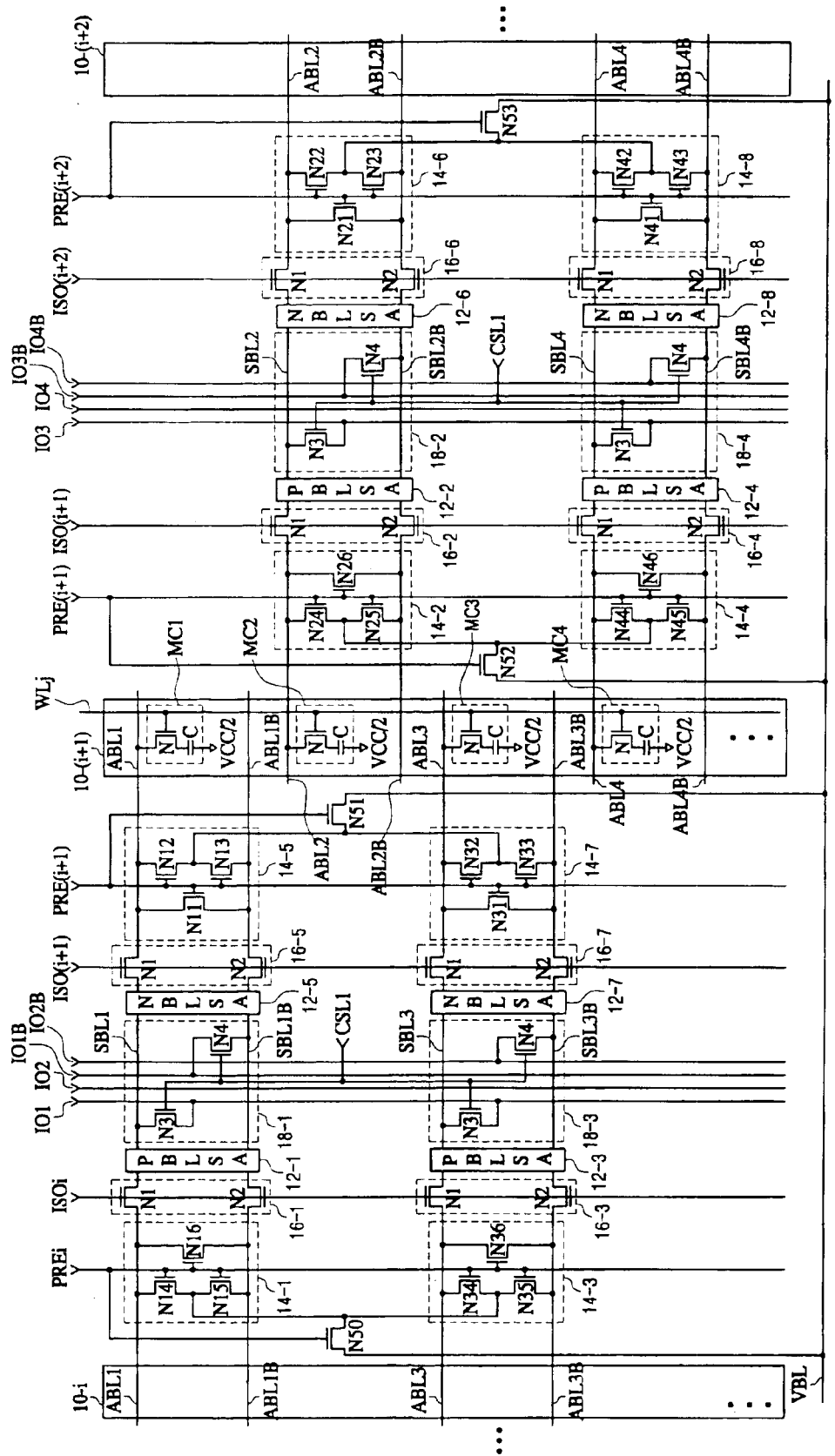
FIG. 3 illustrates a circuit diagram of a bit line pre-charge circuit of a semiconductor memory device in accordance with an embodiment of the present invention.

FIG. 3 illustrates a circuit diagram of a bit line pre-charge circuit in accordance with an embodiment of the present invention. Like reference numerals in FIGS. 1 and 3 denote like elements.

Figure 1:
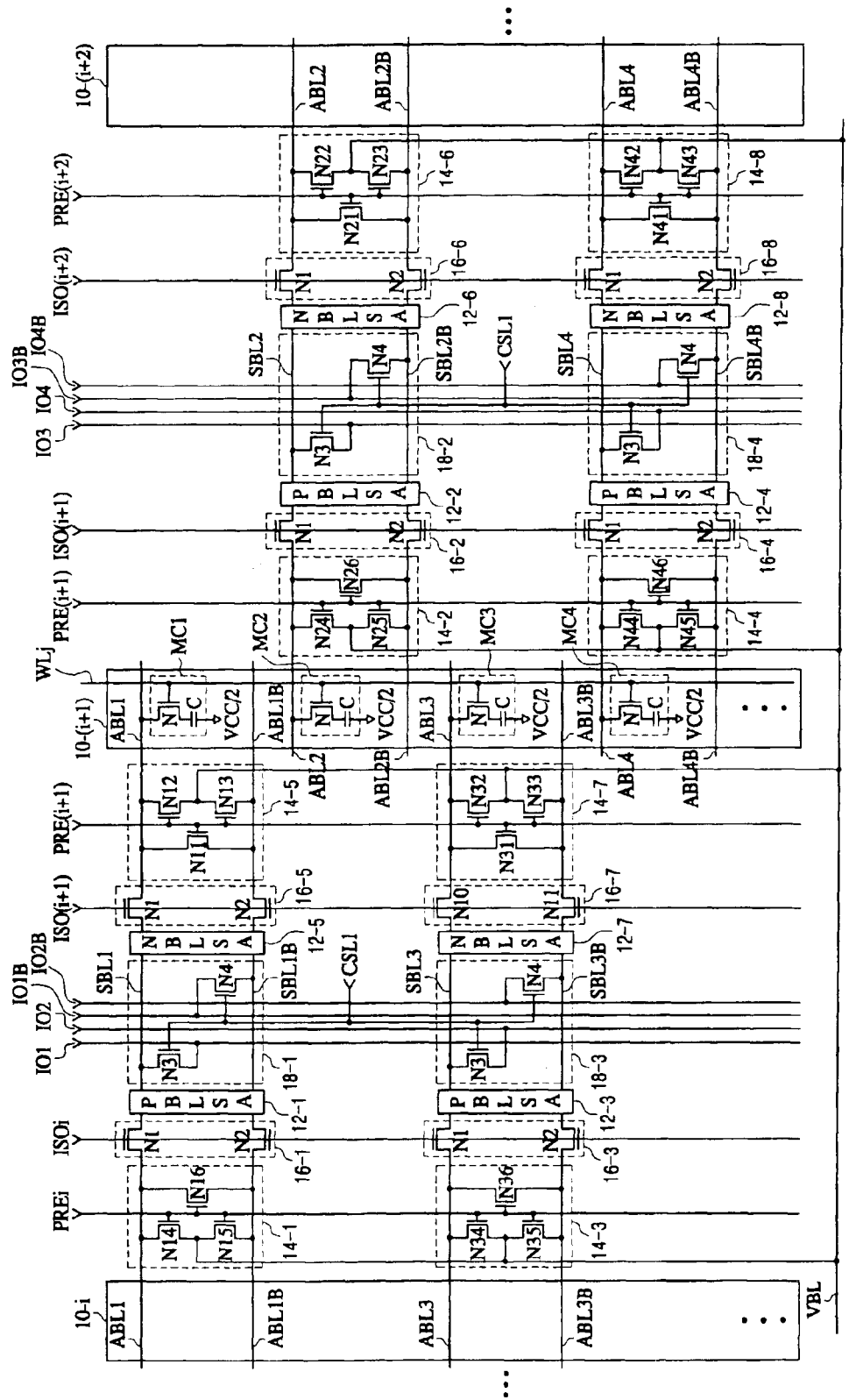
FIG. 1 illustrates a circuit diagram of a bit line pre-charge circuit of a semiconductor memory device in accordance with the prior art.
Figure 2:
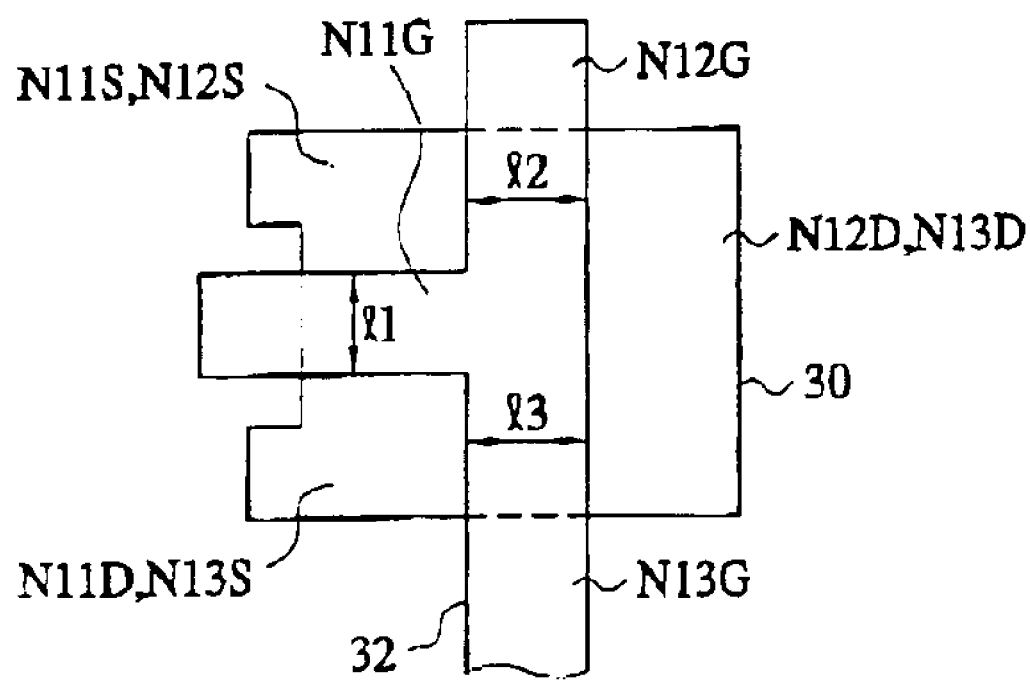
FIG. 2 illustrates a layout of a pre-charge circuit in accordance with the prior art.

As shown in FIG. 3, the bit line pre-charge circuit of the present invention includes all of the elements in FIG. 1, but also includes an NMOS transistor N50 between the pre-charge voltage VBL generation line and the pre-charge circuits 14-1 and 14-3 that are connected between the array bit line pairs ABL1/ABL1B and ALB3/ABL3B, and that are adjacent to each other and are selected by a same column selection signal. The bit line pre-charge circuit of the present invention further includes an NMOS transistor N51 between the pre-charge voltage VBL generation line and the pre-charge circuits 14-5 and 14-7 that are adjacent to each other and selected by the same column selection signal. In addition to NMOS transistors N50 and N51, the bit line pre-charge circuit of the present invention further includes NMOS transistors N52 and N53, which are lacking in the conventional bit line pre-charge circuit of FIG. 1.

The NMOS transistor N52 is positioned between the pre-charge voltage VBL generation line and the pre-charge circuits 14-2 and 14-4 connected between the array bit line pairs ABL2/ABL2B and ABL4/ABL4B, and the NMOS transistor N53 is positioned between the pre-charge voltage VBL generation line and the pre-charge circuits 14-6 and 14-8.

The NMOS transistor N50 has a source connected to a common node of the NMOS transistors (N14, N15) and (N34, N35) that form the pre-charge circuits 14-1 and 14-3, respectively, the pre-charge circuits 14-1 and 14-3 being adjacent to each other, being connected between the array bit line pairs ABL1/ABL1B and ABL3/ABL3B, and being selected by the same column selection signal CSL1. The NMOS transistor N50 further has a gate receiving the corresponding pre-charge control signal PRE (i) and a drain connected to the pre-charge voltage VBL.

The NMOS transistor N51 has a source connected to a common node of the NMOS transistors (N12, N13) and (N32, N33) which form the pre-charge circuits 14-5 and 14-7, respectively, a gate to which the corresponding pre-charge control signal PRE (i+1) is applied and a drain connected to the pre-charge voltage VBL.

The NMOS transistor N52 has a source connected to a common node of the NMOS transistors (N24, N25) and (N44, N45) that form the pre-charge circuits 14-2 and 14-4, respectively, a gate receiving the corresponding pre-charge control signal PRE (i+1) and a drain connected to the pre-charge voltage VBL.

The NMOS transistor N53 has a source connected to a common node of the NMOS transistors (N22, N23) and (N42, N43) that form the pre-charge circuits N14-6 and N14-8, respectively, a gate to which the corresponding pre-charge control signal PRE (i+2) is applied and a drain to which the pre-charge voltage VBL is applied.

The NMOS transistors N50, N51, N52 and N53 have resistances higher than those of the NMOS transistors forming the pre-charge circuits 14-1 to 14-8.

Operation of the bit line pre-charge circuit in FIG. 3 will be described below, assuming a short circuit is formed between the word line WLj and the array bit line ABL1.

During a pre-charge operation, when the isolation control signals ISO (i), ISO (i+1) and ISO (i+2) and the pre-charge control signals PRE (i), PRE (i+1) and PRE (i+2), each having the power supply voltage Vcc, are generated internally, the NMOS transistors in the pre-charge circuits 14-1 to 14-8 and the isolation circuits 16-1 to 16-2 are turned on. When the NMOS transistors in the pre-charge circuits 14-1 to 14-8 and the isolation circuits 16-1 to 16-2 are turned on, the array bit line pairs ABL1/ABL1B, ABL2/ABL2B, ABL3/ABL3B and ABL4/ABL4B, and the sense bit line pairs SBL1/SBL1B, SLB2/SBL2B, SBL3/SBL3B and SLB4/SBL4B, are pre-charged to the pre-charge voltage VBL.

When a short circuit is formed between the word line WLj associated with the memory cell MC1 and the array bit line ABL1, the voltage level of the array bit line ABL1 initially decreases to a ground voltage level because the word line WLj is connected to the ground voltage. However, unlike in the conventional bit line pre-charge circuit, after the initial voltage drop to the ground voltage level in the array bit line ABL1 of the present invention, the pre-charge voltage VBL level does not decrease to the extent of affecting adjacent bit lines because the NMOS transistor N51 blocks the current flowing from the pre-charge voltage VBL generation line to the word line WLj.

The NMOS transistor N51 is connected between NMOS transistor N12 in the pre-charge circuit 14-5 and the pre-charge voltage VBL generating line. The NMOS transistor N51 has a large resistance, which is controlled by the pre-charge control signal PRE (i+1). The resistance of the NMOS transistor N51 is greater than those of the NMOS transistors N12 and N13 forming the pre-charge circuit 14-5. Therefore, because of the location and high resistance of the NMOS transistor N51, very little current flows from the pre-charge voltage VBL generation line to the word line WLj connected to the ground voltage. Therefore, because the NMOS transistor N51 effectively blocks current flow from the pre-charge voltage VBL generation line to the word line WLj and to ground, the voltage level of the pre-charge voltage VBL generation line is not lowered, and does not adversely effect operation characteristics or reliability of the semiconductor device.

The NMOS transistors N50, N51, N52 and N53 are turned on and the pre-charge voltage VBL is applied to the pre-charge circuits 14-1 to 14-8 only during a pre-charge operation of the semiconductor memory device, and are turned off during a standby mode, thereby reducing standby current consumption.

Figure 4:
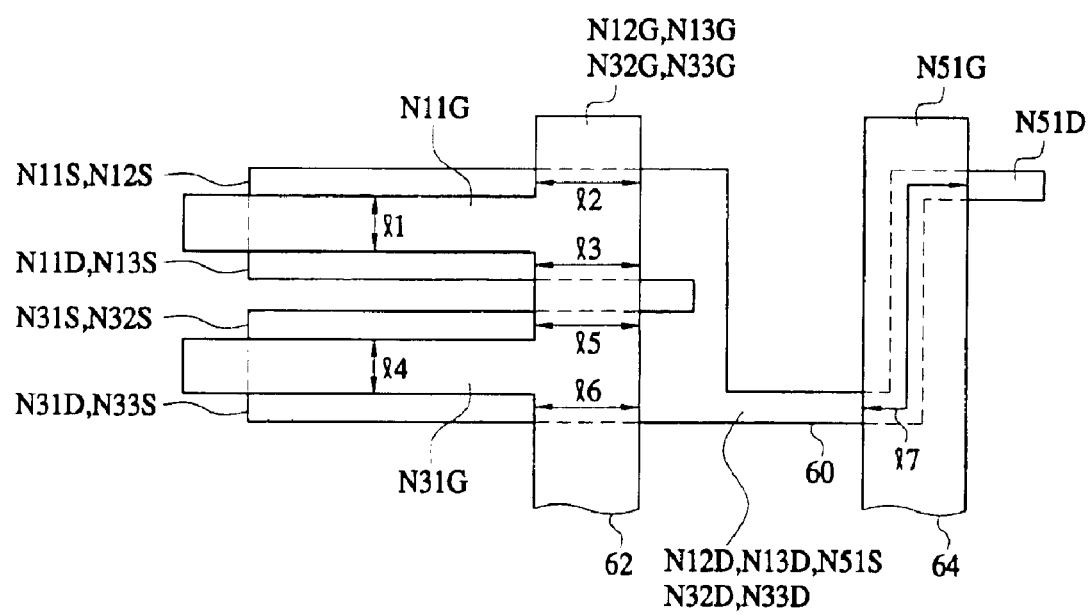
FIG. 4 illustrates a layout of a pre-charge circuit in accordance with an embodiment of the present invention and FIG. 5 illustrates a layout of a pre-charge circuit in accordance with another embodiment of the present invention.

FIG. 4 illustrates a layout of a bit line pre-charge circuit according to an embodiment of the present invention. Reference numerals N11S, N12S and N13S denote source regions of the NMOS transistors N11, N12 and N13, respectively. Reference numerals N11D, N12D and N13D denote drain regions of the NMOS transistors N11, N12 and N13, respectively. Reference numerals N11G, N12G and N13G denote gates of the NMOS transistors N11, N12 and N13, respectively. Reference numerals N31S, N32S and N33S denote source regions of the NMOS transistors N31, N32 and N33, respectively. Reference numerals N31D, N32D and N33D denote drain regions of the NMOS transistors N31, N32 and N33, respectively. Reference numerals N31G, N32G and N33G denote gates of the NMOS transistors N31, N32 and N33, respectively. Reference numerals N51S, N51D and N51G denote a source, a drain and a gate of the NMOS transistor N51, respectively. Reference numerals l1, l2, l3, l4, l5, l6 and l7 denote channel lengths of the NMOS transistors N11, N12, N13, N31, N32, N33 and N51, respectively.

More particularly, the gate N51G of the NMOS transistor N51 is formed across the array bit line ABL1 (not shown) and the array bit line ABL3 (not shown), the drain N51D is formed at a portion where the array bit line ABL1 is formed and the source N51G is formed at a portion where the array bit line ABL3 is formed. Therefore, as shown in FIG. 4, the channel length l7 of the NMOS transistor N51 is much longer than those of l1 to l6 of the other transistors N11, N12, N13, N31, N32 and N33 because the channel of the NMOS transistor N51 extends along a longitudinal direction of the gate N51G. Therefore, the NMOS transistor N51 has a higher resistance than those of the other NMOS transistors N11, N12, N13, N31, N32 and N33, thereby suppressing current flow from the pre-charge voltage generation line to the word line. Positions of the drain N51D and the source N51S may be exchanged.

For realizing the arrangement described above, there is provided an active area 60 in a semiconductor substrate (not shown). The active area 60 comprises two branches, an upper branch and a lower branch, extending along a horizontal direction and in parallel to each other wherein the branches are connected to each other at right ends thereof, a first thin and long bar connected to and extended from the right end of the lower branch in an opposite direction of the branches, a second thin and long bar connected to one end of the first thin and long bar and extending perpendicular to the first thin and long bar and a third thin and long bar connected to an upper end of the second thin and long bar and arranged in a horizontal direction.

The gate N11G of the NMOS transistor N11 extends over an upper branch of the branches in a horizontal direction. The source N11S and the drain N11D of the NMOS transistor N11 are formed at both sides of the gate N11G in the upper branch.

The gates N12G and N13G of the NMOS transistors N12 and N13 are formed across the upper branch and perpendicular to the gate N11G. The gates N12G and N13G are connected to the right end of the gate N11G. The source N12S and the drain N12D of the NMOS transistor N12 are formed at both sides of the gate N12G in the upper branch and the source N13S and the drain N13D of the NMOS transistor N13 are also formed at both sides of the gate N13G in the upper branch.

Accordingly, a left and upper portion of the upper branch is used as a common source N11S and N12S of the NMOS transistors N11 and N12. A left and lower portion of the upper branch is used as the drain N11D of the NMOS transistor N11 and the source N13S of the NMOS transistor N13. A right portion of the upper branch is used as a common drain N12D and N13D of the NMOS transistors N12 and N13.

The gates N12G and N13G are connected in series. Reference characters l1, l2, and l3 designate channel lengths of the NMOS transistors N11, N12 and N13, respectively.

The gate N31G of the NMOS transistor N31 extends along the lower branch in a horizontal direction. The source N31S and the drain N31D of the NMOS transistor N31 are formed on both sides of the gate N31G in the lower branch.

The gates N32G and N33G of the NMOS transistors N32 and N33 are formed across the lower branch perpendicular to the gate N31G, and are connected to the right end of the gate N31G. The gates N32G and N33G are connected in series. Reference characters l4, l5, and l6 designate channel lengths of the NMOS transistors N31, N32 and N33, respectively.

Therefore, a left and upper portion of the lower branch is used as a common source N31S and N32S of the NMOS transistors N31 and N32, respectively. A left and lower portion of the lower branch is used as a drain N31D of the NMOS transistor N31 and a source N33S of the NMOS transistor N33. A right portion of the upper and lower branches and the first thin and long bar of the active area are used as a common drain N12D, N13D, N32D, N33D of the NMOS transistors N12, N13, N32, N33 and as a source N51S.

The gates N12G, N13G, N32G and N33G of the NMOS transistors N12, N13, N32 and N33 are connected in series. The gates N11G, N12G, N13G, N31G, N32G and N33G are formed in a single body 62. The gate N51G of the NMOS transistor N51 is formed between the drain N51D, and a common area used as the drains N12D, N13D, N32D, N33D and the source N51S of the NMOS transistor N51.

As shown in FIG. 4, the channel length l7 of the NMOS transistor N51 is longer than a channel width of the NMOS transistor N51, so that resistance of the NMOS transistor N51 is higher than that of the NMOS transistors N12, N13, N32 and N33.

In FIG. 4, one NMOS transistor N51 having a high resistance is formed between two adjacent array bit line pairs but may be formed between every pair of the array bit line pairs.

By forming the pre-charge circuit in accordance with the present invention in the layout shown in FIG. 4, a voltage drop of the pre-charge voltage VBL generation line is prevented during a pre-charge operation even if a short circuit is formed between the word line and the array bit line pair. Further, standby current consumption is reduced because the NMOS transistors N50, N51, N52 and N53 are turned off during a standby mode, so that current does not flow through the NMOS transistors forming the pre-charge circuits during the standby mode.

Figure 5:
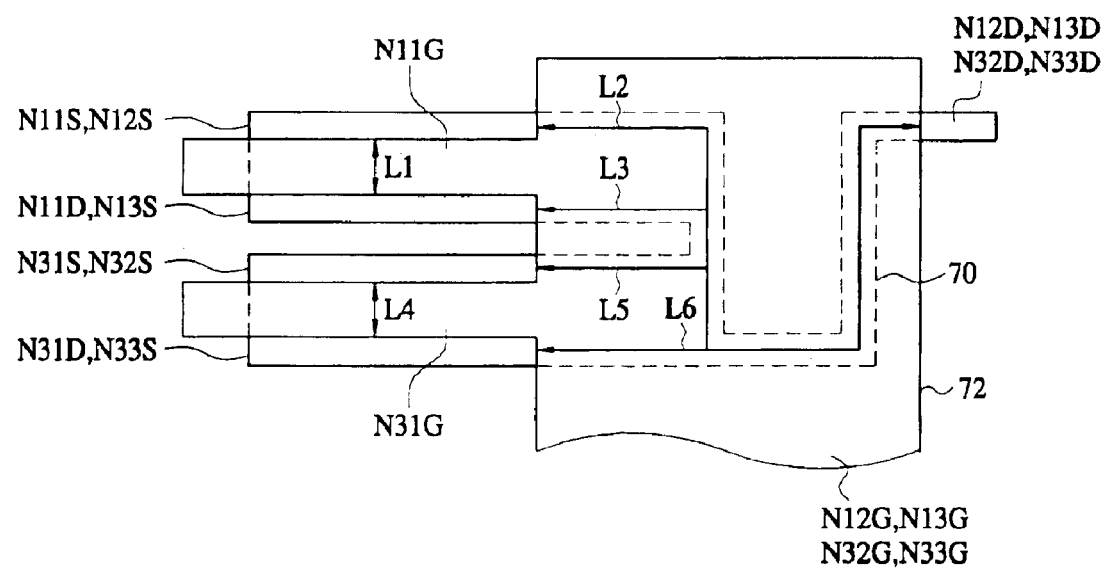

FIG. 5 illustrates a layout of a pre-charge circuit in accordance with another example of the present invention. FIG. 5 illustrates the layout of NMOS transistors (N11, N12 and N13) and (N31, N32 and N33) forming pre-charge circuits 14-5 and 14-7, respectively, connected between array bit line pairs ABL1/ABL1B (not shown) and ABL3/ABL3B (not shown).

In FIG. 5, reference numerals L1, L2, L3, L4, L5, L6 denote channel lengths of the NMOS transistors N11, N12, N13, N31, N32 and N33, respectively.

Active area 70 having a same shape as the active area 60 in FIG. 4 is formed in a semiconductor substrate (not shown). That is, the active area 70 includes two branches, an upper branch and a lower branch, each extending in a horizontal direction and parallel to each other, a first thin and long bar connected to the right end of the lower branch, a second thin and long bar connected to the right end of the first thin and long bar and extending perpendicular to the first thin and long bar, and a third thin and long bar connected to an upper end of the second thin and long bar and extending in a horizontal direction.

Gates N12G, N13G, N32G and N33G of the NMOS transistors N12, N13, N32 and N33 are formed in a single body 72 that covers a right part of the branches, the first thin and long bar, the second thin and long bar and a left part of the third thin and long bar. Gates N11G and N31G of the NMOS transistors N11 and N31 are formed along the upper branch and the lower branch, respectively and perpendicular to the gates N12G, N13G, N32G and N33G. All of the gates N11G, N12G, N13G, N31G, N32G and N33G of the NMOS transistors N11, N12, N13, N31, N32 and N33 are formed in a single body 72.

A left and upper portion of the upper branch forms sources N11S and N12S of the NMOS transistors N11 and N12, a left and lower part of the upper branch forms a drain N11D and a source N13S of the NMOS transistors N11 and N13, a left and upper portion of the lower branch forms sources N31S and N32S of the NMOS transistors N31 and N32, and a left and lower portion of the lower branch forms a drain N31D and a source N33S of the NMOS transistors N31 and N33, respectively. Drains N12D, N13D, N32D and N33D of the NMOS transistors N12, N13, N32 and N33 are common and formed in a right portion of the third thin and long bar, the portion being uncovered by the gates.

More particularly, the drains N12D, N13D, N32D and N33D of the NMOS transistors N12, N13, N32 and N33 connected to the pre-charge voltage VBL generation line (not shown) are formed in an area of the pair of array bit lines ABL1/ABL1B (not shown) and are connected to a first end of the channels of the NMOS transistors N12, N13, N32 and N33. The channels extend to an area of the array bit line ABL3B (not shown) and have second ends connected to the sources of the NMOS transistors N12, N13, N32 and N33. That is, the respective second ends of the channels of the NMOS transistors N12 and N13 are connected to the respective sources N12S and N13S formed in the upper branch, so that the NMOS transistors N12 and N13 have channel lengths of L2 and L3, respectively. The respective second ends of the channels of the NMOS transistors N32 and N33 are connected to the respective sources N32S and N33S formed in the lower branch, so that the NMOS transistors N32 and N33 have channel lengths of L5 and L6, respectively.

As shown in FIG. 5, the NMOS transistors N12, N13, N32 and N33 forming the pre-charge circuits have long channel lengths in comparison with respective channel widths, so that resistances of the NMOS transistors N12, N13, N32 and N33 are higher than those of the NMOS transistors N11 and N31.

The bit line pre-charge circuit having the layout shown in FIG. 5 does not have the high resistance NMOS transistors N50, N51, N52 and N53 connected between the pre-charge voltage VBL generation line (not shown) and the pre-charge circuits 14-1 to 14-8 (not shown). In the embodiment illustrated in FIG. 5, the NMOS transistors forming the pre-charge circuits 14-1 to 14-8 (not shown) are configured to have high resistances by lengthening the channel lengths of the NMOS transistors forming the pre-charge circuits 14-1 to 14-8.

Further, in the bit line pre-charge circuit of FIG. 5, the active area and the gates of the NMOS transistors N11, N12, N13, N31, N32 and N33 forming the pre-charge circuits 14-5 and 14-7 (not shown), which are: 1) connected between the array bit line pairs ABL1/ABL1B and ABL3/ABL3B (not shown), 2) adjacent to each other, and 3) selected by the same column selection signal CSL1 (not shown), are formed in a single body 70, respectively.

Accordingly, even if a voltage level of the array bit line pairs is lowered during the pre-charge operation, the high resistance of the NMOS transistors forming the pre-charge circuits prevents the current flowing from the array bit line pairs to the pre-charge voltage VBL generation line, thereby preventing a voltage level of the pre-charge voltage VBL generation line from decreasing. Further, in the standby operation of the semiconductor memory device, the standby current consumption decreases due to the high resistances of the NMOS transistors forming the pre-charge circuits.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A bit line pre-charge circuit for a semiconductor memory device, comprising:

first and a second transistors connected in series between a pair of bit lines and each having a gate to which a pre-charge control signal is applied for transimitting a pre-charge voltage to the pair of bit lines in response to the pre-charge control signal; and a third transistor connected between the pair of bit lines and having a gate receiving the pre-charge control signal as an input for equalizing voltage levels of the pair of bit lines, wherein the first and second transistors have channel lengths longer than that of the third transistor, so that the first and second transistors have resistances higher than that of the third transistor.

2. A bit line pre-charge circuit of a semiconductor memory device, comprising:

a plurality of pre-charge circuits, each connected between a pair of bit lines for pre-charging the respective pair of bit lines to a pre-charge voltage in response to a pre-charge control signal; and a pre-charge voltage transmitting circuit for transmitting the pre-charge voltage to the pre-charge circuit in response to the pre-charge control signal, wherein the pre-charge voltage transmitting circuit is connected to at least two pre-charge circuits.

3. The bit line pre-charge circuit as claimed in claim 2, wherein the pre-charge voltage transmitting circuit has a resistance higher than that of the pre-charge circuits.

4. The bit line pre-charge circuit as claimed in claim 2, wherein the bit-line pre-charge circuit includes:

first and second NMOS transistors connected in series between the pair of bit lines and having a gate receiving the pre-charge control signal as an input for transmitting the pre-charge voltage to the pair of bit lines in response to the pre-charge control signal; and a third NMOS transistor connected between the pair of bit lines and having a gate receiving the pre-charge control signal as an input for equalizing voltage levels of the pair of bit lines in response to the pre-charge control signal.

5. The bit line pre-charge circuit as claimed in claim 4, wherein the pre-charge voltage transmitting circuit comprises a fourth NMOS transistor connected between a common node of the first and second NMOS transistors and a pre-charge voltage generating line supplying the pre-charge voltage, and having a gate to which the pre-charge control signal is applied.

6. A bit line pre-charge circuit of a semiconductor memory device, comprising:

a plurality of word lines respectively selected in response to a plurality of word line selection signals;

a plurality of pairs of bit lines formed perpendicular to the word lines and selected in response to a plurality of column selection signals;

a plurality of memory cells, each connected between one of the plurality of word lines and one of the plurality of pairs of bit lines; and a plurality of pre-charge circuits for pre-charging the plurality of pairs of bit lines in response to a plurality of pre-charge control signals, wherein each of the pre-charge circuits includes first and second NMOS transistors connected in series between a pair of the plurality of pairs of bit lines and having a gate receiving one of the plurality of pre-charge control signals as an input for transmitting a pre-charge voltage to the pair of the plurality of pairs of bit lines in response to the one of the plurality of pre-charge control signals, and a third NMOS transistor connected between the pair of the plurality of pairs of bit lines and having a gate receiving the one of the plurality of pre-charge control signals as an input for equalizing voltage levels of the pair of the plurality of pairs of bit lines in response to the one of the plurality of pre-charge control signals, and the first and second transistors having channel lengths longer than that of the third transistor, so that the first and second transistors have resistances higher than that of the third transistor.

7. A bit line pre-charge circuit of a semiconductor memory device, comprising:

a plurality of word lines respectively selected by a plurality of word line selection signals;

a plurality of pairs of bit lines formed perpendicular the plurality of word lines and selected by a plurality of column selection signals;

a plurality of memory cells, each connected between a word line of the plurality of word lines and a pair of the plurality of pairs of bit lines;

a plurality of pre-charge circuits for pre-charging the plurality of pairs of bit lines in response to a plurality of pre-charge control signals; and a plurality of pre-charge voltage transmitting circuits for transmitting a pre-charge voltage to the pre-charge circuits in response to the plurality of pre-charge control signals.

8. The bit line pre-charge circuit as claimed in claim 7, wherein a resistance of each of the pre-charge voltage transmitting circuits is higher than those of the pre-charge circuits.

9. The bit line pre-charge circuit as claimed in claim 7, wherein each of the pre-charge circuits includes:

first and second NMOS transistors connected in series between a pair of the plurality of pairs of bit lines and having a gate receiving a pre-charge control signal of the plurality of pre-charge control signals; and a third NMOS transistor connected between the pair of the plurality of pairs of bit lines and having a gate receiving the pre-charge control signal.

10. The bit line pre-charge circuit as claimed in claim 9, wherein each of the pre-charge voltage transmitting circuits corresponds to a predetermined number of pre-charge circuits that are adjacent to each other and that are selected by the same column selection signal.

11. The bit line pre-charge circuit as claimed in claim 9, wherein each of the pre-charge voltage transmitting circuits is comprised of a fourth NMOS transistor connected to a common node of the first and second NMOS transistors that form the pre-charge circuits and that are turned on in response to the pre-charge control signal.

12. A bit line pre-charge circuit of a semiconductor memory device that includes a first pre-charge circuit formed in a first bit line area and a second pre-charge circuit formed in a second bit line area, comprising:

a first transistor formed in the first bit line area; and a second transistor formed in the second bit line area, wherein a channel of the first transistor starts from a first area of the first bit line area and extends over the second bit line area.

13. The bit line pre-charge circuit as claimed in claim 12, wherein the channel of the first transistor extends to a second area of the first bit line area.

14. The bit line pre-charge circuit as claimed in claim 13, wherein the first and second areas are connected to the same bit line area.

15. The bit line pre-charge circuit as claimed in claim 12, wherein a channel of the second transistor starts from the second bit line area and ends in the first bit line area.

16. A bit line pre-charge circuit of a semiconductor memory device having a first bit line area in which a first transistor is formed and a second bit line area in which a second transistor is formed, comprising:

a first active area in which the first transistor is formed;

a second active area in which the second transistor is formed; and a third active area in which a third transistor is formed, wherein one side of the first active area is connected to one side of the second active area and the one side of the second active area is connected to one side of the third active area.

17. The bit line pre-charge circuit as claimed in claim 16, wherein the third transistor is formed across the first bit line area and the second bit line area.

18. The bit line pre-charge circuit as claimed in claim 16, wherein channels of the first, second and third transistors are formed in the first, second and third active areas, respectively.

* * * * *